(12) United States Patent
Jung

(10) Patent No.: US 11,742,023 B2
(45) Date of Patent: Aug. 29, 2023

(54) MEMORY DEVICE AND OPERATING METHOD THEREOF

(71) Applicant: SK hynix Inc., Icheon-si (KR)

(72) Inventor: Young Don Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 56 days.

(21) Appl. No.: 17/226,780

(22) Filed: Apr. 9, 2021

(65) Prior Publication Data

US 2022/0115069 A1 Apr. 14, 2022

(30) Foreign Application Priority Data

Oct. 12, 2020 (KR) .................. 10-2020-0131446

(51) Int. Cl.
 *G11C 16/06* (2006.01)
 *G11C 16/04* (2006.01)
(52) U.S. Cl.
 CPC .......... *G11C 16/06* (2013.01); *G11C 16/0483* (2013.01)
(58) Field of Classification Search
 CPC ............................ G11C 16/06; G11C 16/0483
 USPC .................................................... 365/185.12
 See application file for complete search history.

(56) References Cited

U.S. PATENT DOCUMENTS

| 2014/0043914 | A1* | 2/2014 | Shim | G11C 16/34 |
| | | | | 365/185.22 |
| 2018/0137900 | A1* | 5/2018 | Kim | G11C 7/1048 |
| 2019/0147964 | A1* | 5/2019 | Yun | G11C 16/3404 |
| | | | | 365/185.22 |
| 2019/0206497 | A1* | 7/2019 | Lim | G11C 16/00 |

FOREIGN PATENT DOCUMENTS

| KR | 100564568 B1 | 3/2006 |
| KR | 100753698 B1 | 8/2007 |

* cited by examiner

*Primary Examiner* — Anthan Tran
(74) *Attorney, Agent, or Firm* — WILLIAM PARK & ASSOCIATES LTD.

(57) ABSTRACT

A memory device includes a page buffer circuit including a plurality of page buffer stages each including a plurality of page buffers. The memory device also includes a control circuit configured to generate page buffer control signals for controlling the plurality of page buffers. The control circuit is also configured to probe each of a plurality of page buffer control signal groups configured with the page buffer control signals through a probing path corresponding to each of the plurality of page buffer control signal groups.

10 Claims, 17 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2020-0131446, filed on Oct. 12, 2020, in the Korean Intellectual Property Office, the entire disclosure of which is incorporated herein by reference.

BACKGROUND

1. Technical Field

The present disclosure generally relates to an electronic device, and more particularly, to a memory device and an operating method thereof.

2. Related Art

A storage device is a device which stores data under the control of a host device such as a computer or a smart phone. The storage device may include a memory device for storing data and a memory controller for controlling the memory device. The memory device may be classified as a volatile memory device or a nonvolatile memory device.

A volatile memory device is a memory device in which data is stored only when power is supplied, and stored data is lost when the supply of power is interrupted. A volatile memory device may include Static Random Access Memory (SRAM), Dynamic Random Access Memory (DRAM), and the like.

A nonvolatile memory device is a memory device in which data is retained even when the supply of power is interrupted. A nonvolatile memory device may include Read Only Memory (ROM), Programmable ROM (PROM), Electrically Programmable ROM (EPROM), Electrically Erasable ROM (EEROM), flash memory, and the like.

SUMMARY

Some embodiments are directed to a memory device capable of checking a signal of a page buffer by using a reduced or minimum number of pads, and an operating method of the memory device.

In accordance with an embodiment of the present disclosure, a memory device includes a page buffer circuit including a plurality of page buffer stages each including a plurality of page buffers. The memory device also includes a control circuit configured to generate page buffer control signals for controlling the plurality of page buffers and configured to probe each of a plurality of page buffer control signal groups configured with the page buffer control signals through a probing path corresponding to each of the plurality of page buffer control signal groups.

In accordance with another embodiment of the present disclosure is a method for operating a memory device including a plurality of probing pads and a measuring pad. The method includes: generating page buffer control signals for controlling a plurality of page buffers; providing the page buffer control signals to the plurality of page buffers; and probing each of a plurality of page buffer control signal groups configured with the page buffer control signals through a probing path corresponding to each of the plurality of page buffer control signal groups.

In accordance with still another embodiment of the present disclosure is a control circuit for controlling signals provided to a plurality of page buffer control stages each including a plurality of page buffers. The control circuit includes: a plurality of probing pads each probing any one of a plurality of page buffer control signal groups configured with page buffer control signals for controlling the plurality of page buffers; a measuring pad measuring page buffer control signal groups probed by the plurality of probing pads; and a control signal generator. The control signal generator is configured to generate the page buffer control signals, a probing control signal for controlling a probing operation of the plurality of probing pads, and a measurement control signal for controlling a measuring operation of the measuring pad.

BRIEF DESCRIPTION OF THE DRAWINGS

Example embodiments will now be described more fully hereinafter with reference to the accompanying drawings; however, they may be embodied in different forms and should not be construed as being limited to the descriptions set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional descriptions disclosed herein are merely illustrative for the purpose of describing embodiments according to the concept of the present disclosure. Embodiments of the present disclosure can be implemented in various forms and should not be construed as being limited to the particular embodiments set forth herein.

Figure 1:
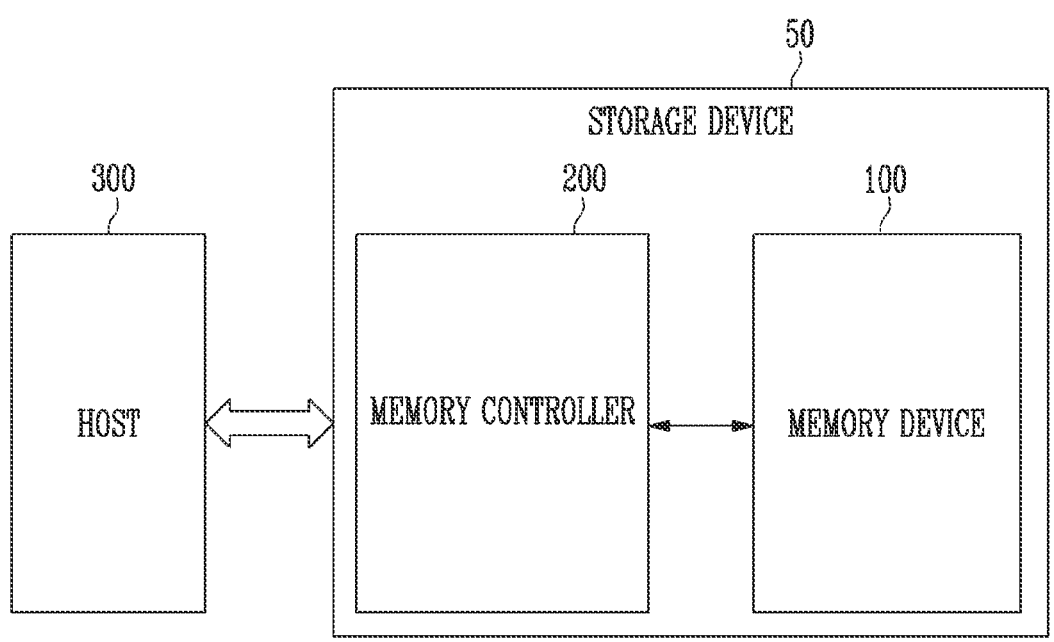
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 for controlling an operation of the memory device 100. The storage device 50 may be a device for storing data under the control of a host 300, such as a mobile phone, a smart phone, an MP3 player, a laptop computer, a desktop computer, a game console, a TV, a tablet PC, or an in-vehicle infotainment system.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array (not shown) including a plurality of memory cells for storing data.

Each of the memory cells may operate as any one of a Single-Level Cell (SLC) storing one data bit, a Multi-Level Cell (MLC) storing two data bits, a Triple-Level Cell (TLC) storing three data bits, and a Quadruple-Level Cell (QLC) storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may use Double Data Rate Synchronous Dynamic Random Access Memory (DDR SDRAM), Low Power Double Data Rate 4 (LPDDR4) SDRAM, Graphics Double Data Rate (GDDR) SRAM, Low Power DDR (LPDDR), Rambus Dynamic Random Access Memory (RDRAM), NAND flash memory, vertical NAND flash memory, NOR flash memory, Resistive Random Access Memory (RRAM), Phase-Change Random Access Memory (PRAM), Magnetoresistive Random Access Memory (MRAM), Ferroelectric Random Access Memory (FRAM), Spin Transfer Torque Random Access Memory (STT-RAM), or the like. In this specification, for convenience of description, a case where the memory device 100 uses NAND flash memory is assumed and described.

The memory device 100 may receive a command CMD and an address ADDR from the memory controller 200, and access a zone selected by the address ADDR in the memory cell array. The memory device 100 may perform an operation indicated by the command CMD on the zone selected by the address ADDR. For example, the memory device 100 may perform a write operation (program operation), a read operation, or an erase operation. In the program operation, the memory device 100 may program data in the zone selected by the address ADDR. In the read operation, the memory device 100 may read data from the zone selected by the address ADDR. In the erase operation, the memory device 100 may erase data stored in the zone selected by the address ADDR.

The memory controller 200 may control overall operations of the storage device 50.

When power is applied to the storage device 50, the memory controller 200 may execute firmware (FW). When the memory device 100 is a flash memory device, the FW may include a host interface layer (HIL) for controlling communication with the host 300, a flash translation layer (FTL) for controlling communication between the host and the memory device 100, and a flash interface layer (FIL) for controlling communication with the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. In this specification, the LBA and a "logic address" or "logical address" may be used with the same meaning. In this specification, the PBA and a "physical address" may be used with the same meaning.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host 300, and transmit the command, the address, and the data to the memory device 100. For example, the memory controller 200 may provide the memory device 100 with a command, an address, and data, which are used to perform read and program operations accompanied in performing wear leveling, read reclaim, garbage collection, etc.

In an embodiment, the memory controller 200 may control at least two memory devices 100. The memory controller 200 may control the memory devices according to an interleaving technique so as to improve operational performance. The interleaving technique may be a technique for controlling operations on at least two memory devices 100 to overlap with each other.

The host 300 may communicate with the storage device 50, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
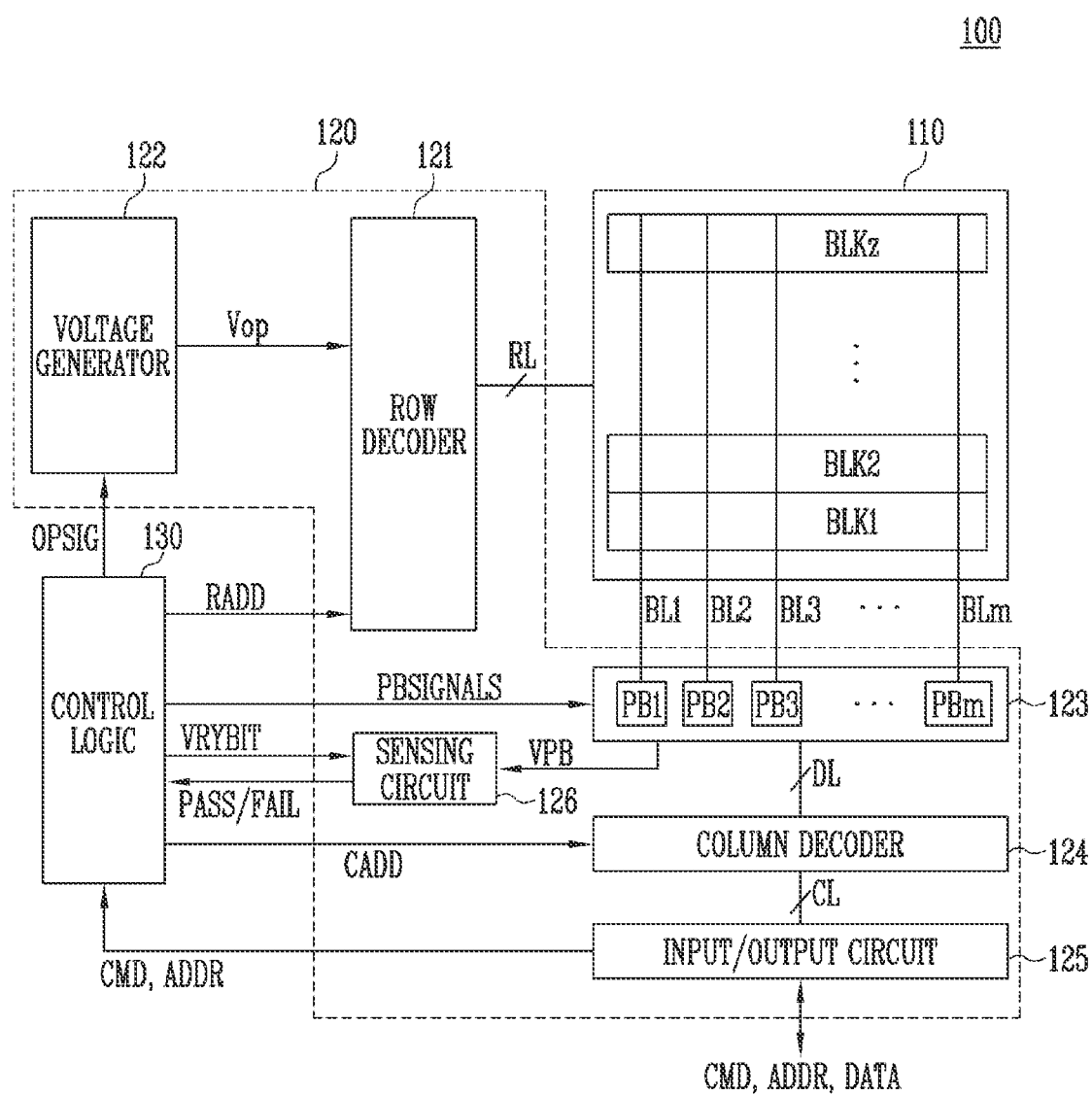
FIG. 2 is a diagram illustrating a structure of a memory device shown in FIG. 1.

FIG. 2 is a diagram illustrating a structure of the memory device 100 shown in FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz are connected to a page buffer group 123 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single-Level Cell (SLC) storing one data bit, a Multi-Level Cell (MLC) storing two data bits, a Triple-Level Cell (TLC) storing three data bits, or a Quadruple-Level Cell (QLC) storing four data bits.

The peripheral circuit 120 may perform a program operation, a read operation, or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLm or discharge the applied voltages under the control of the control logic 130.

The peripheral circuit 120 may include the row decoder 121, the voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 operates under the control of the control logic. The row decoder 121 receives a row address RADD from the control logic 130.

The row decoder 121 decodes the row address RADD. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according to the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage having a level higher than that of the verify voltage to the unselected word lines.

In a read operation, the row decoder 121 may apply a read voltage to the selected word line, and apply a read pass voltage having a level higher than that of the read voltage to the unselected word lines.

In an embodiment, an erase operation of the memory device 100 is performed in a memory block unit. In the erase operation, the row decoder 121 may select one memory block according to the decoded address. In the erase operation, the row decoder 121 may apply a ground voltage to word lines connected to the selected memory blocks.

The voltage generator 122 operates under the control of the control logic 130. The voltage generator 122 generates a plurality of voltages by using an external power voltage supplied to the memory device 100. Specifically, the voltage generator may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to mth page buffers PB1 to PBm. The first to mth page buffers PB1 to PBm are connected to the memory cell array 110 respectively through first to mth bit lines BL1 to BLm. The first to mth bit lines BL1 to BLm operate under the control of the control logic 130. Specifically, the first to mth bit lines BL1 to BLm may operate in response to page buffer control signals PBSIGNALS. For example, the first to mth page buffers PB1 to PBm may temporarily store data received through the first to mth bit lines BL1 to BLm, or sense a voltage or current of the bit lines BL1 to BLm in a read or verify operation.

Specifically, in a program operation, the first to mth page buffers PB1 to PBm may transfer data DATA received through the input/output circuit 125 to selected memory cells through the first to mth bit lines BL1 to BLm, when a program voltage is applied to a selected word line. Memory cells of a selected page are programmed according to the transferred data DATA. A memory cell connected to a bit line to which a program allow voltage (e.g., a ground voltage) is applied may have an increased threshold voltage. A threshold voltage of a memory cell connected to a bit line to which a program inhibit voltage (e.g., a power voltage) is applied may be maintained. In a program verify operation, the first to mth page buffers PB1 to PBm read page data from the selected memory cells through the first to mth bit lines BL1 to BLm.

In a read operation, the first to mth page buffers PB1 to PBm read data DATA from the memory cells of the selected page through the first to mth bit lines BL1 to BLm, and outputs the read data DATA to the input/output circuit 125 under the control of the column decoder 124.

In an erase operation, the first to mth page buffers PB1 to PBm may float the first to mth bit lines BL1 to BLm.

The column decoder 124 may communicate data between the input/output circuit 125 and the page buffer group 123 in response to a column address CADD. For example the column decoder 124 may communicate data with the first to mth page buffers PB1 to PBm through data lines DL, or communicate data with the input/output circuit 125 through column lines CL.

The input/output circuit 125 may transfer a command CMD and an address ADDR, which are received from the memory controller 200 described with reference to FIG. 1, to the control logic 130, or exchange data DATA with the column decoder 124.

In a read operation or verify operation, the sensing circuit 125 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT signal in response to the command CMD and the address ADDR. Also, the control logic 130 may determine whether the verify operation has passed or failed in response to the pass signal PASS or the fail signal FAIL. The control logic 130 may be implemented as hardware, software, or a combination of hardware and software. For example, the control logic 130 may be a control logic circuit operating in accordance with an algorithm and/or a processor executing control logic code.

Figure 3:
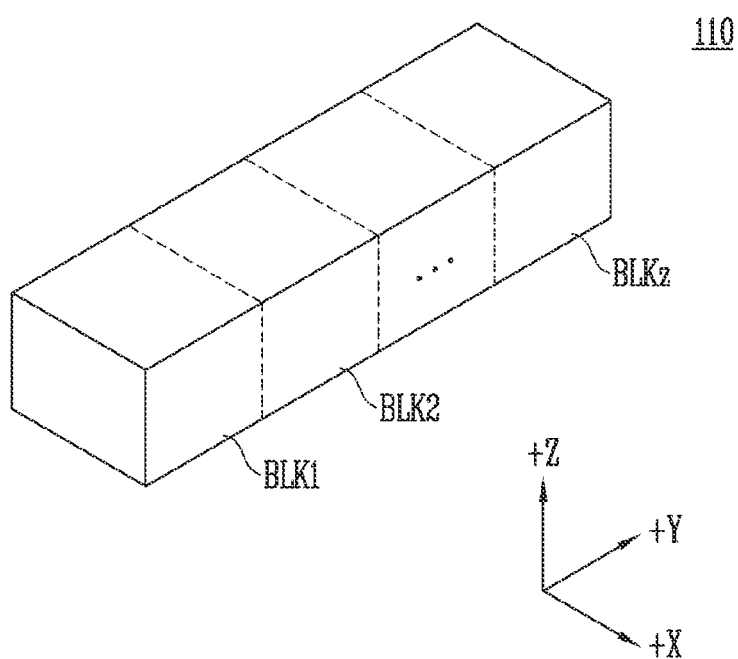
FIG. 3 is a diagram illustrating an embodiment of a memory cell array shown in FIG. 2.

FIG. 3 is a diagram illustrating an embodiment of the memory cell array shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
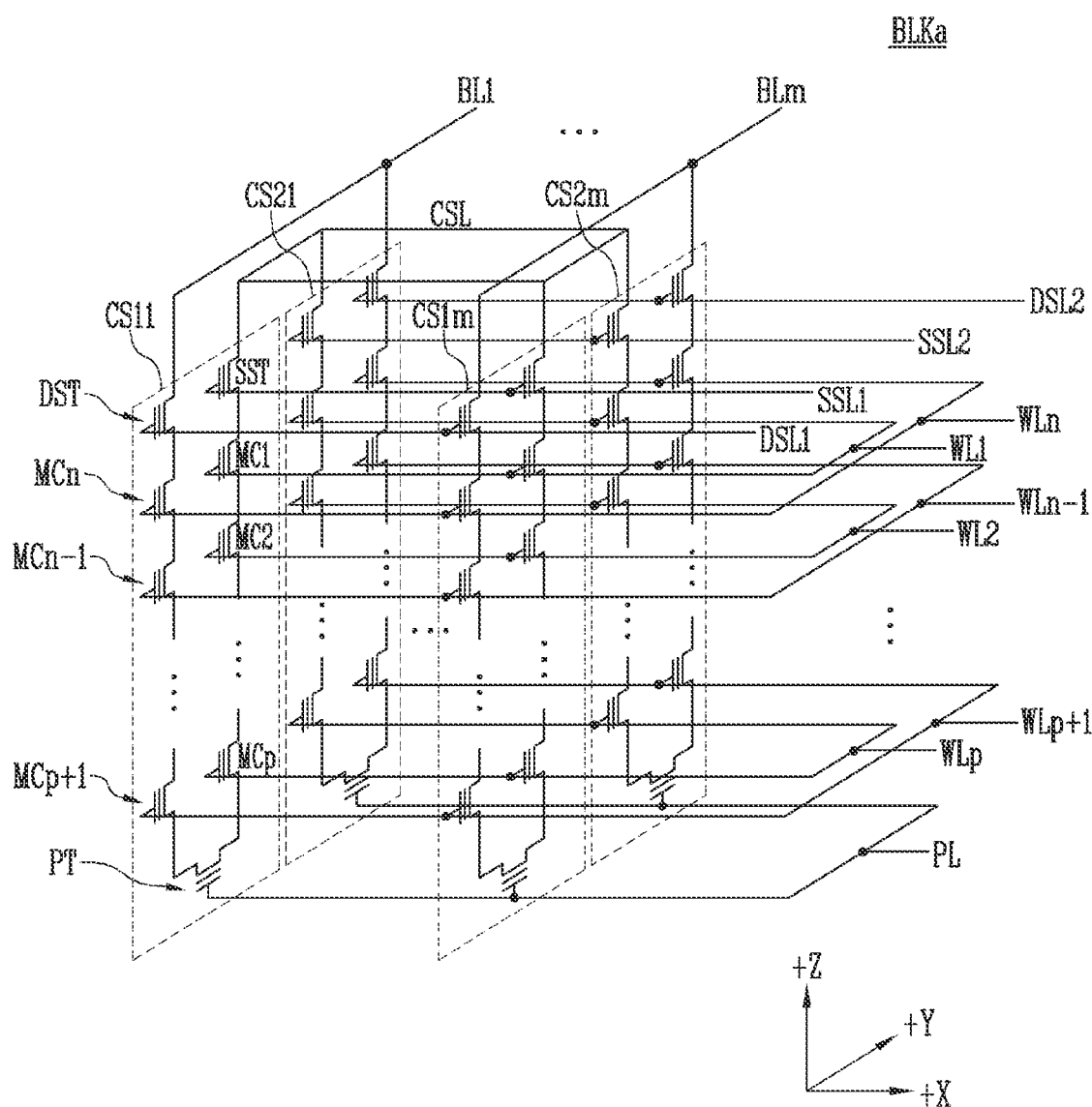
FIG. 4 is a circuit diagram illustrating a memory block among memory blocks shown in FIG. 3.

FIG. 4 is a circuit diagram illustrating any one memory block BLKa among the memory blocks BLK1 to BLKz shown in FIG. 3.

Referring to FIG. 4, the memory block BLKa may include a plurality of memory cell strings CS11 to CS1m and CS21 to CS2m. In an embodiment, each of the plurality of memory cell strings CS11 to CS1m and CS21 to CS2m may be formed in a 'U' shape. In the memory block BLKa, m memory cell strings are arranged in a row direction (i.e., a +X direction). FIG. 4 illustrates two memory cell strings arranged in a column direction (i.e., a +Y direction). However, this is for convenience of description, and it will be understood that three memory cell strings may be arranged in the column direction.

Each of the plurality of memory cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each memory cell string. In an embodiment, a pillar for providing at least one of the channel layer, the tunneling insulating layer, the charge storage layer, and the blocking insulating layer may be provided in each memory cell string.

The source select transistor SST of each memory cell string is connected between a common source line CSL and memory cells MC1 to MCp.

In an embodiment, the source select transistors of memory cell strings arranged on the same row are connected to a source select line extending in the row direction, and the source select transistors of memory cell strings arranged on different rows are connected to different source select lines. In FIG. 4, the source select transistors of the memory cell strings CS11 to CS1m on a first row are connected to a first source select line SSL1. The source select transistors of the memory cell strings CS21 to CS2m on a second row are connected to a second source select line SSL2.

In another embodiment, the source select transistors of the memory cell strings CS11 to CS1m and CS21 to CS2m may be commonly connected to one source select line.

The first to nth memory cells MC1 to MCn of each memory cell string are connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each memory cell string are connected to first to nth word lines WL1 to WLn, respectively.

A gate of the pipe transistor PT of each memory cell string is connected to a pipe line PL.

The drain select transistor DST of each memory cell string is connected between a corresponding bit line and the memory cells MCp+1 to MCn. Memory cell strings arranged in the row direction are connected to a drain select line extending in the row direction. The drain select transistors of the memory cell strings CS11 to CS1m on the first row are connected to a first drain select line DSL1. The drain select transistors of the memory cell strings CS21 to CS2m on the second row are connected to a second drain select line DSL2.

Memory cell strings arranged in the column direction are connected to a bit line extending in the column direction. In FIG. 4, the memory cell strings CS11 and CS21 on a first column are connected to a first bit line BL1. The memory cell strings CS1m and CS2m on an mth column are connected to an mth bit line BLm.

Memory cells connected to the same word line in the memory cell strings arranged in the row direction constitute one page. For example, memory cells connected to the first word line WL1 in the memory cell strings CS11 to CS1m on the first row constitute one page. Memory cells connected to the first word line WL1 in the memory cell strings CS21 to CS2m on the second row constitute another page. As any one of the drain select lines DSL1 and DSL2 is selected, memory cell strings arranged in one row direction may be selected. As any one of the word lines WL1 to WLn is selected, one page may be selected in the selected memory cell strings.

In another embodiment, even bit lines and odd bit lines may be provided instead of the first to mth bit lines BL1 to BLm. In addition, even-numbered memory cell strings among the memory cell strings CS11 to CS1m or CS21 to CS2m arranged in the row direction may be connected to the even bit lines, respectively, and odd-numbered memory cell strings among the memory cell strings CS11 to CS1m or CS21 to CS2m arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 5:
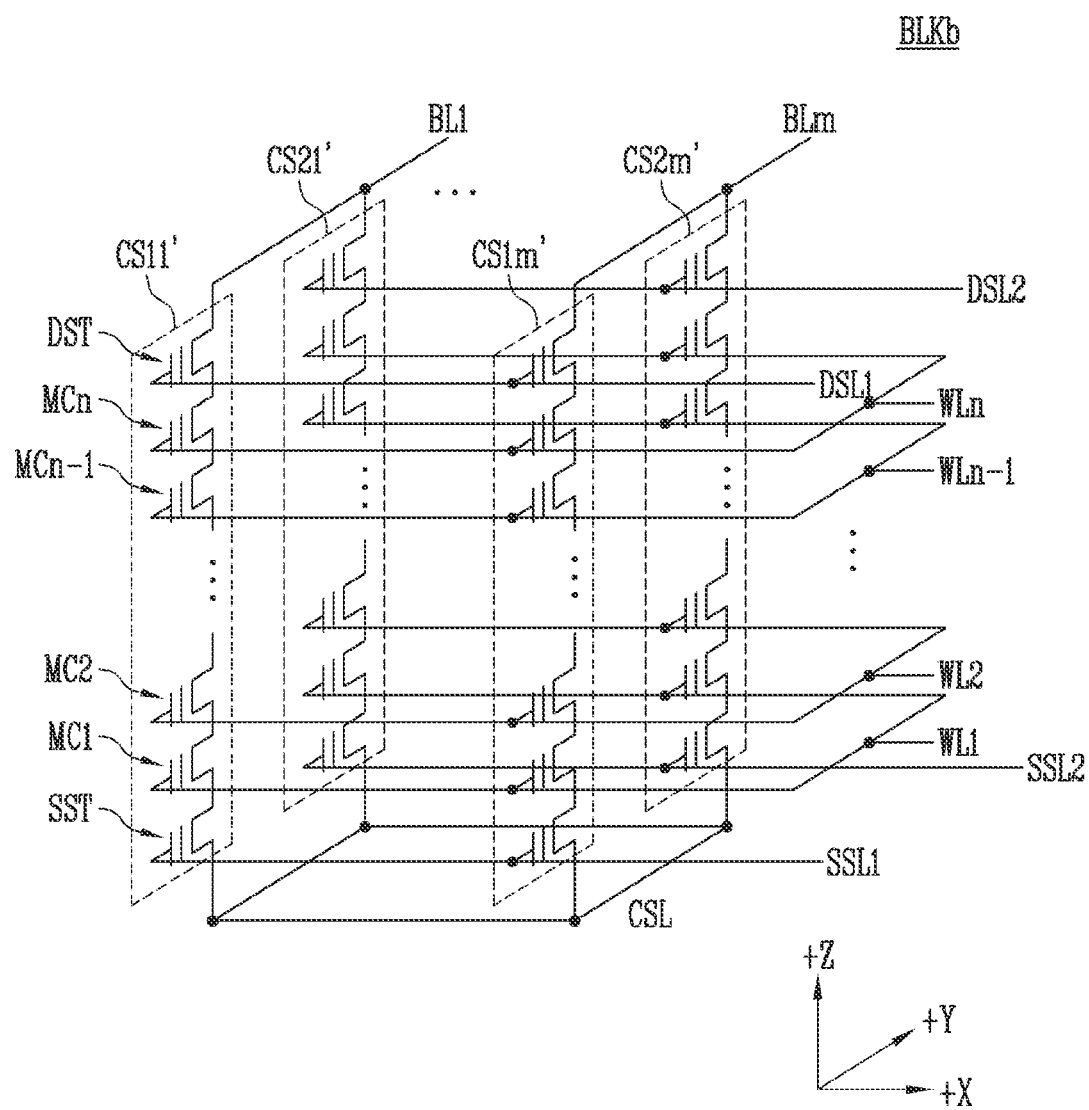
FIG. 5 is a circuit diagram illustrating another embodiment of a memory block among the memory blocks shown in FIG. 3.

FIG. 5 is a circuit diagram illustrating another embodiment of the one memory block BLKb among the memory blocks BLK1 to BLKz shown in FIG. 3.

Referring to FIG. 5, the memory block BLKb may include a plurality of memory cell strings CS11' to CS1m' and CS21' to CS2m'. Each of the plurality of memory cell strings CS11' to CS1m' and CS21' to CS2m' extends along the +Z direction. Each of the plurality of memory cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each memory cell string is connected between a common source line CSL and the memory cells MC1 to MCn. The source select transistors of memory cell strings arranged on the same row are connected to the same source select line. The source select transistors of the memory cell strings CS11' to CS1m' arranged on a first row are connected to a first source select line SSL1. Source select transistors of the memory cell strings CS21' to CS2m' arranged on a second row are connected to a second source select line SSL2. In another embodiment, the source select transistors of the memory cell strings CS11' to CS1m' and CS21' to CS2m' may be commonly connected to one source select line.

The first to nth memory cells MC1 to MCn of each memory cell string are connected in series between the source select transistor SST and the drain select transistor DST. Gate electrodes of the first to nth memory cells MC1 to MCn are connected to first to nth word lines WL1 to WLn, respectively.

The drain select transistor DST of each memory cell string is connected between a corresponding bit line and the memory cells MC1 to MCn. The drain select transistors of memory cell strings arranged in the row direction are connected to a drain select line extending in the row direction. The drain select transistors of the memory cell strings CS11' to CS1m' on the first row are connected to a first drain select line DSL1. The drain select transistors of the memory cell strings CS21' to CS2m' on the second row are connected to a second drain select line DSL2.

Consequently, the memory block BLKb of FIG. 5 has a circuit similar to that of the memory block BLKa of FIG. 4, except that the pipe transistor PT is excluded from each memory cell string in FIG. 5.

In another embodiment, even bit lines and odd bit lines may be provided instead of the first to mth bit lines BL1 to BLm. In addition, even-numbered memory cell strings among the memory cell strings CS11' to CS1m' or CS21' to CS2m' arranged in the row direction may be connected to the even bit lines, respectively, and odd-numbered memory cell strings among the memory cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 6:
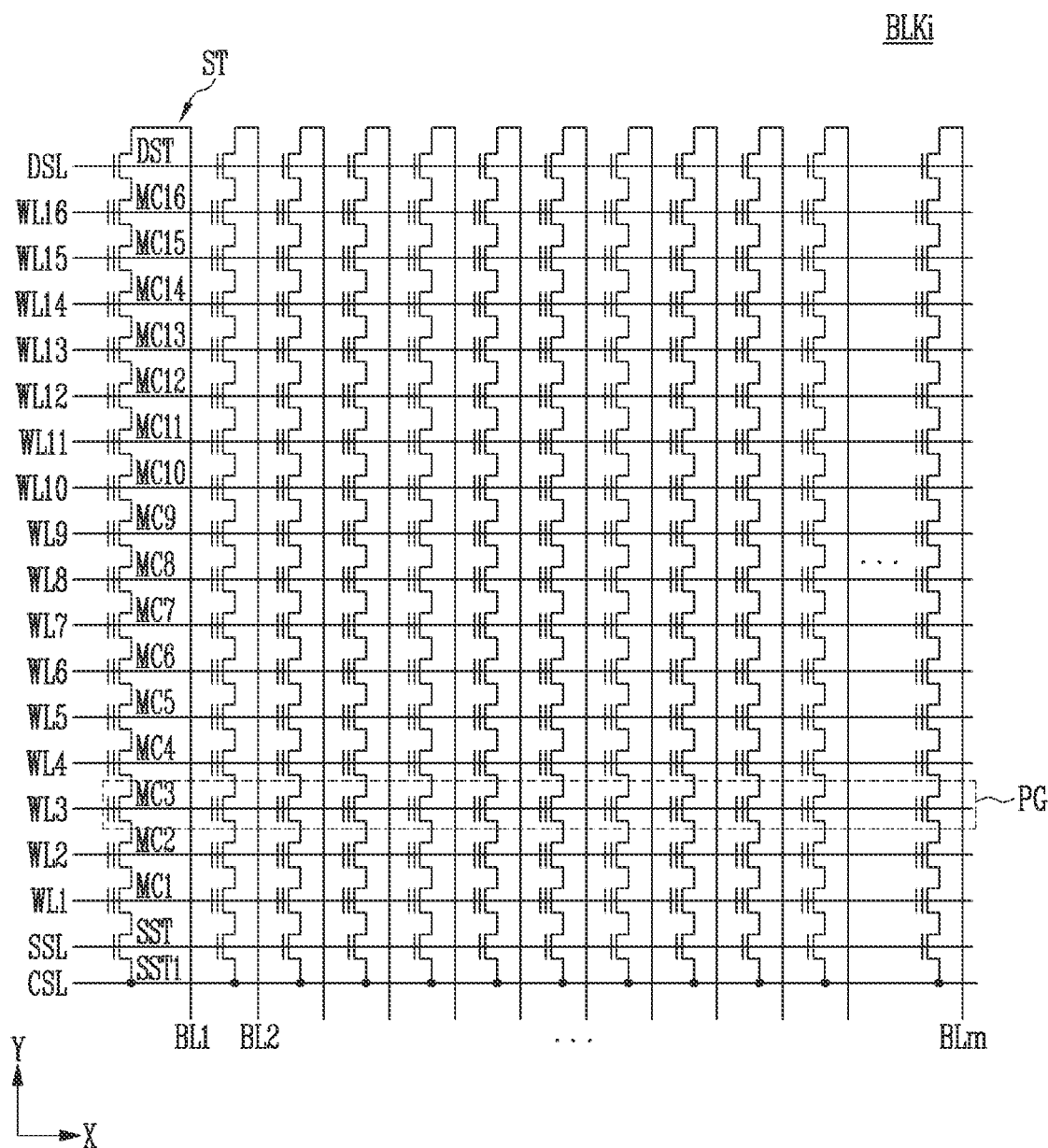
FIG. 6 is a circuit diagram illustrating still another embodiment of a memory block among the memory blocks shown in FIG. 3.

FIG. 6 is a circuit diagram illustrating still another embodiment of the one memory block BLKi among the memory blocks BLK1 to BLKz shown in FIG. 3.

Referring to FIG. 6, in the memory block BLKi, a plurality of word lines arranged in parallel to each other may be connected between a first select line and a second select line. The first select line may be a source select line SSL, and the second select line may be a drain select line DSL. More specifically, the memory block BLKi may include a plurality of memory cell strings ST connected between bit lines BL1 to BLm and a common source line CSL. The bit lines BL1 to BLm may be respectively connected to the memory cell strings ST, and the common source line CSL may be commonly connected to the memory cell strings ST. The memory cell strings ST may be configured identically to one another, and therefore, a memory cell string ST connected to a first bit line BL1 will be described in detail as an example.

The memory cell string ST may include a source select transistor SST, a plurality of memory cells MC1 to MC16, and a drain select transistor DST, which are connected in series to each other between the common source line CSL and the first bit line BL1. At least one drain select transistor DST may be included in one memory cell string ST, and source select transistors of which a number is greater than that of the source select transistor SST shown in the drawing and memory cells of which a number is greater than that of the memory cells MC1 to MC16 shown in the drawing may be included in the one memory cell string ST.

A source of the source select transistor SST may be connected to the common source line SL, and a drain of the drain select transistor DAT may be connected to the first bit line BL1. The memory cells MC1 to MC16 may be connected in series between the source select transistor SST and the drain select transistor DST. Gates of source select transistors SST included in different memory cell strings ST may be connected to the source select line SSL, and gates of drain select transistors DST included in different memory cell strings ST may be connected to the drain select line DSL. Gates of the memory cells MC1 to MC16 may be connected to a plurality of word lines WL1 to WL16. A group of memory cells connected to the same word line among memory cells included in different memory cell strings ST may be referred to as a physical page PG. Therefore, physical pages PG corresponding to the number of the word lines WL1 to WL16 may be included in the memory block BLKi.

One memory cell may store one-bit data. The one memory cell is generally referred to as a single-level cell (SLC). One physical page PG may store one logical page (LPG) data. One LPG data may include data bits corresponding to the number of memory cells included in the one physical page PG.

One memory cell may store two or more-bit data. One physical page PG may store two or more LPG data.

Figure 7:
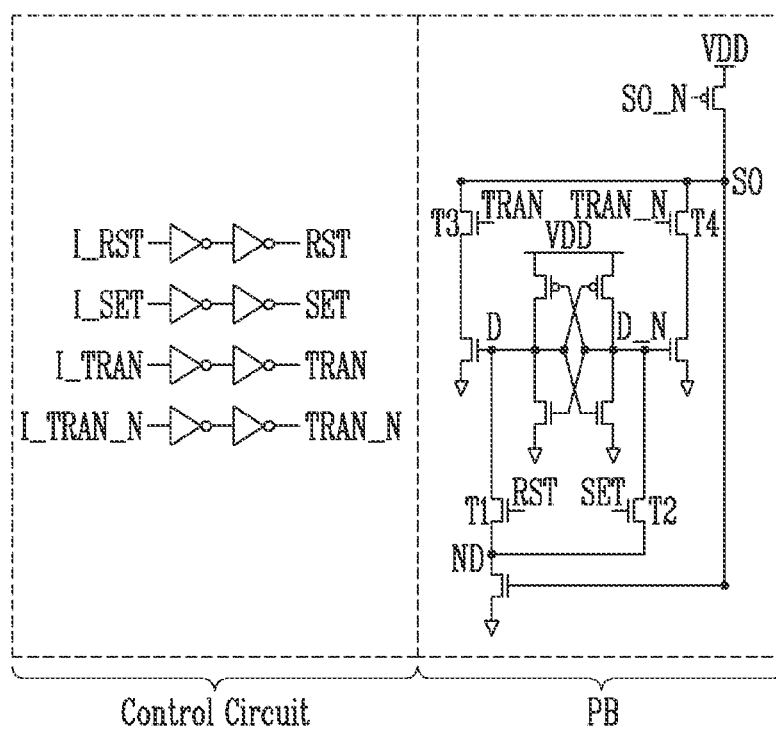
FIG. 7 illustrates an operation of a control circuit and a page buffer in accordance with an embodiment of the present disclosure.

FIG. 7 is an example illustrating an operation of a control circuit and a page buffer in accordance with an embodiment of the present disclosure.

Referring to FIG. 7, the memory device 100 may include a control circuit Control Circuit and a page buffer PB.

In FIG. 7, the control circuit Control Circuit may be a circuit for executing the control logic 130 shown in FIG. 2. In addition, the page buffer PB may be any one of the page buffers shown in FIG. 2.

The control circuit Control Circuit may control an operation of the page buffer PB.

The control circuit Control Circuit may generate page buffer control signals for controlling the page buffer PB. In an embodiment, the page buffer control signals may include a reset signal RST, a set signal SET, a transmission signal TRAN, a transmission signal TRAN_N, and the like. For example, the control circuit Control Circuit may generate the reset signal RST in response to a control signal I_RST. Also, the control circuit Control Circuit may generate the set signal SET in response to a control signal I_SET. Also, the control circuit Control Circuit may generate the transmission signal TRAN in response to a control signal I_TRAN. Also, the control circuit Control Circuit may generate the transmission signal TRAN_N in response to a control signal I_TRAN_N.

Also, the control circuit Control Circuit may provide the page buffer control signals to the page buffer PB.

The page buffer PB may operate according to the page buffer control signals. For example, a first transistor T1 may be connected between a node D and a node ND, and electrically connect the node D and the node ND in response to the reset signal RST. A second transistor T2 may be connected between a node D_N and the node ND, and electrically connect the node D_N and the node ND in response to the set signal SET. For example, when the reset signal RST is applied at a logic high level to the first transistor T1 in a state in which a sensing node SO is precharged to a high level, the node D and the node D_N are respectively initialized to a logic low level and the logic high level. Also, when the set signal SET is applied at the logic high level to the second transistor T2 in the state in which the sensing node SO is precharged to the high level, the node D and the node D_N are respectively initialized to the logic high level and the logic low level. A third transistor T3 may be connected between the node D and the sensing node SO, and electrically connect the node D and the sensing node SO in response to the transmission signal TRAN. A fourth transistor T4 may be connected between the node D_N and the sensing node SO, and electrically connect the node D_N and the sensing node SO in response to the transmission signal TRAN_N.

Figure 8:
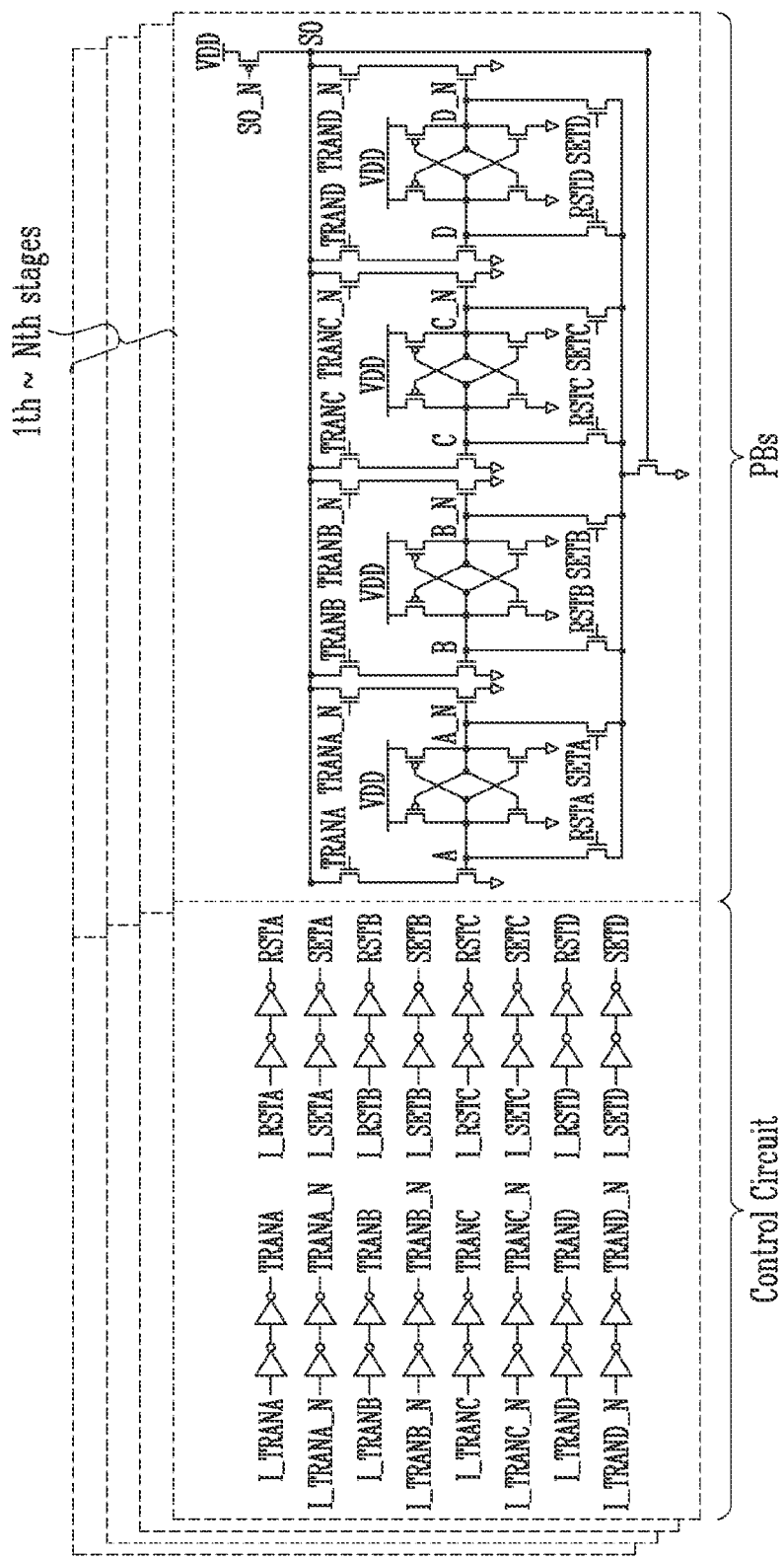
FIG. 8 illustrates another operation of a control circuit and a page buffer in accordance with an embodiment of the present disclosure.

FIG. 8 is another example illustrating an operation of a control circuit and a page buffer in accordance with an embodiment of the present disclosure.

In FIG. 8, it is assumed that the memory device 100 includes a plurality of stages 1th to Nth stages. The plurality of stages 1th to Nth stages may operate independently from one another. Each of the plurality of stages 1th to Nth stages may include a control circuit Control Circuit and four page buffers PBs. However, the number of page buffers is not limited to four. The number of page buffers may different in different embodiments. In addition, it is assumed that one page buffer is controlled according to four signals. However, this is merely illustrative, and the number of signals used for controlling the page buffer may vary.

The control circuit Control Circuit may control page buffers included in the same stage. Therefore, one control circuit Control Circuit included in each of the plurality of stages 1th to Nth stages may control four page buffers PBs. Accordingly, the one control circuit Control Circuit may control 16 signals RSTA, RSTB, RSTC, RSTD, SETA, SETB, SETC, SETD, TRANA, TRANB, TRANC, TRAND, TRANA_N, TRANB_N, TRANC_N, and TRAND_N for controlling the page buffers PBs.

In addition, operations of the control circuit Control Circuit and each of the page buffers PBs are identical to those of the control circuit Control Circuit and the page buffer PB described above, and therefore, a detailed description of this will be omitted.

Meanwhile, in the case of a memory device such as a peri under cell (PUC), the page buffers PBs are located under a memory cell array. Therefore, an upper metal pad (uPAD) for measuring a signal is to be used so as to check signals of the page buffers PBs. The upper metal pad is to be configured with a top metal. As shown in FIG. 8, when 16 signals are generated from one stage, 16×N signals are generated in the plurality of stages 1th to Nth stages. However, because a region for disposing the upper metal pad is limited, signals of all page buffers PBs cannot be checked in a memory device having a PUC structure. In addition, because any signal measurement path does not exist in a memory device in a package form, a signal of a page buffer cannot be checked.

Thus, in accordance with the embodiment of the present disclosure, signals of page buffers can be checked by using a reduced or minimum number of pads.

Figure 9:
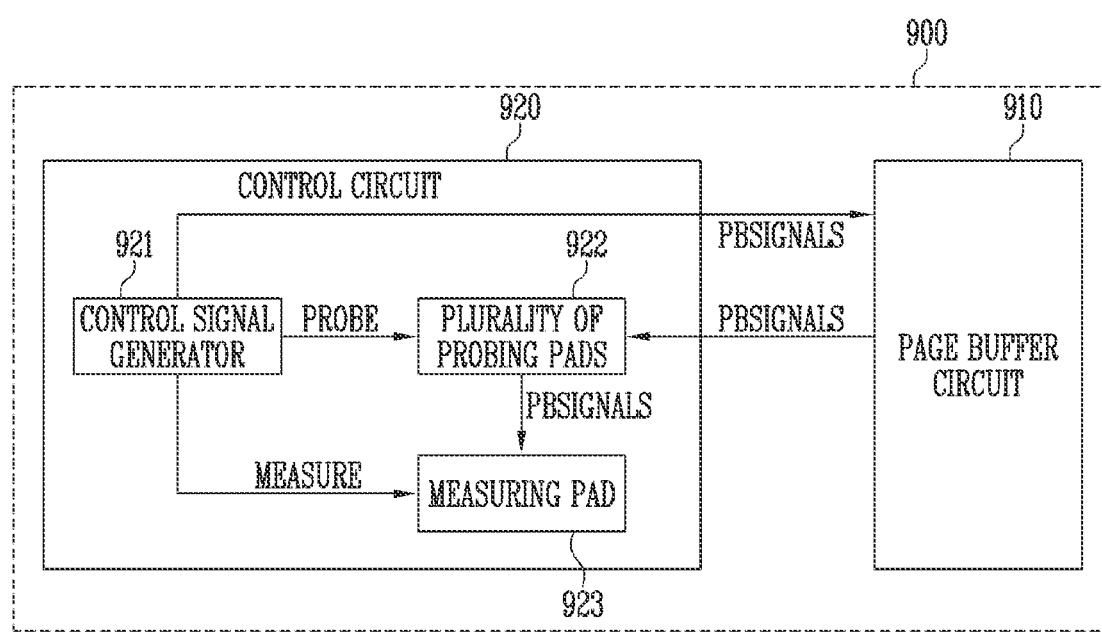
FIG. 9 is a diagram illustrating a memory device in accordance with an embodiment of the present disclosure.

FIG. 9 is a diagram illustrating a memory device 900 in accordance with an embodiment of the present disclosure.

In FIG. 9, the memory device 900 may be the memory device 200 shown in FIG. 2.

Referring to FIG. 9, the memory device 900 may include a page buffer circuit 910 and a control circuit 920.

The page buffer circuit 910 may include a plurality of page buffer stages including a plurality of page buffers. The page buffer stages may be the stages shown in FIG. 8.

In accordance with an embodiment, the control circuit 920 may probe a plurality of page buffer control signal groups configured with page buffer control signals PBSIGNALS through probing paths respectively corresponding to the plurality of page buffer control signal groups.

Specifically, the control circuit 920 may include a control signal generator 921, a plurality of probing pads 922, and a measuring pad 923.

The control signal generator 921 may generate page buffer control signals PBSIGNALS for controlling the plurality of page buffers. The control signal generator 921 may provide the page buffer control signals PBSIGNALS to the page buffer circuit 910. In an embodiment, the control signal generator 921 may provide, in parallel, the page buffer control signals PBSIGNALS to the plurality of page buffer stages included in the page buffer circuit 910. That is, because the plurality of page buffer stages receive the page buffer control signals PBSIGNALS at a constant interval, the plurality of page buffer stages may operate in parallel according to the page buffer control signals PBSIGNALS.

In an embodiment, the control signal generator 921 may generate a probing control signal PROBE for controlling transistors connected between the plurality of page buffers and the plurality of probing pads 922.

In an embodiment, the control signal generator 921 may generate a measurement control signal MEASURE for controlling transistors connected between the plurality of probing pads 922 and the measuring pad 923.

Each of the plurality of probing pads 922 may probe any one of the plurality of page buffer control signal groups.

Each of the plurality of page buffer control signal groups may include page buffer control signals which have the same kind while being provided in parallel to different page buffer stages among the page buffer control signals PBSIGNALS. For example, it is assumed that a first page buffer stage to an Nth page buffer stage are included in the page buffer circuit 910, and page buffer signals provided to each page buffer stage include a reset signal, a set signal, a first transmission signal, and a second transmission signal. A first page buffer control signal group among the plurality of page buffer control signal groups may include reset signals of the plurality of page buffer stages. Specifically, the first page buffer control signal group may be a group including reset signals respectively provided to the first page buffer stage to the Nth page buffer stage. In addition, a second page buffer control signal group among the plurality of page buffer control signal groups may include set signals of the plurality of page buffer stages. Specifically, the second page buffer control signal group may be a group including set signals respectively provided to the first page buffer stage to the Nth page buffer stage. In addition, a third page buffer control signal group among the plurality of page buffer control signal groups may include first transmission signals of the plurality of page buffer stages. Specifically, the third page buffer control signal group may be a group including first transmission signals respectively provided to the first page buffer stage to the Nth page buffer stage. In addition, a fourth page buffer control signal group among the plurality of page buffer control signal groups may include second transmission signals of the plurality of page buffer stages. Specifically, the fourth page buffer control signal group may be a group including second transmission signals respectively provided to the first page buffer stage to the Nth page buffer stage.

In an embodiment, each of the plurality of probing pads 922 may probe a page buffer control signal group corresponding to each of the plurality of probing pads 922 among the plurality of page buffer control signal groups. Specifically, each of the plurality of probing pads 922 may probe a page buffer control signal group through a probing path connected to each of the plurality of probing pads 922.

In an embodiment, when the transistors connected between the plurality of page buffers and the plurality of probing pads 922 are turned on according to the probing control signal PROBE, each of the plurality of probing pads 922 may probe a page buffer control signal group allocated thereto. Also, the plurality of probing pads 922 may provide the probed buffer control signal groups to the measuring pad 923.

In an embodiment, the plurality of probing pads 922 may be configured as an upper metal pad (uPAD). For example, the plurality of probing pads 922 may be disposed with a top metal located at an upper portion of the memory device 900.

The measuring pad 923 may measure page buffer control signal groups probed by the plurality of probing pads 922.

In an embodiment, when the transistors connected between the plurality of probing pads 922 and the measuring pad 923 are turned off according to the measurement control signal MEASURE, the measuring pad 923 may measure the probed page buffer control signal groups. The measured page buffer control signal groups may be used to analyze page buffers.

In an embodiment, the measuring pad 923 may be disposed with a top metal located at an upper portion of the memory device 900.

Figure 10:
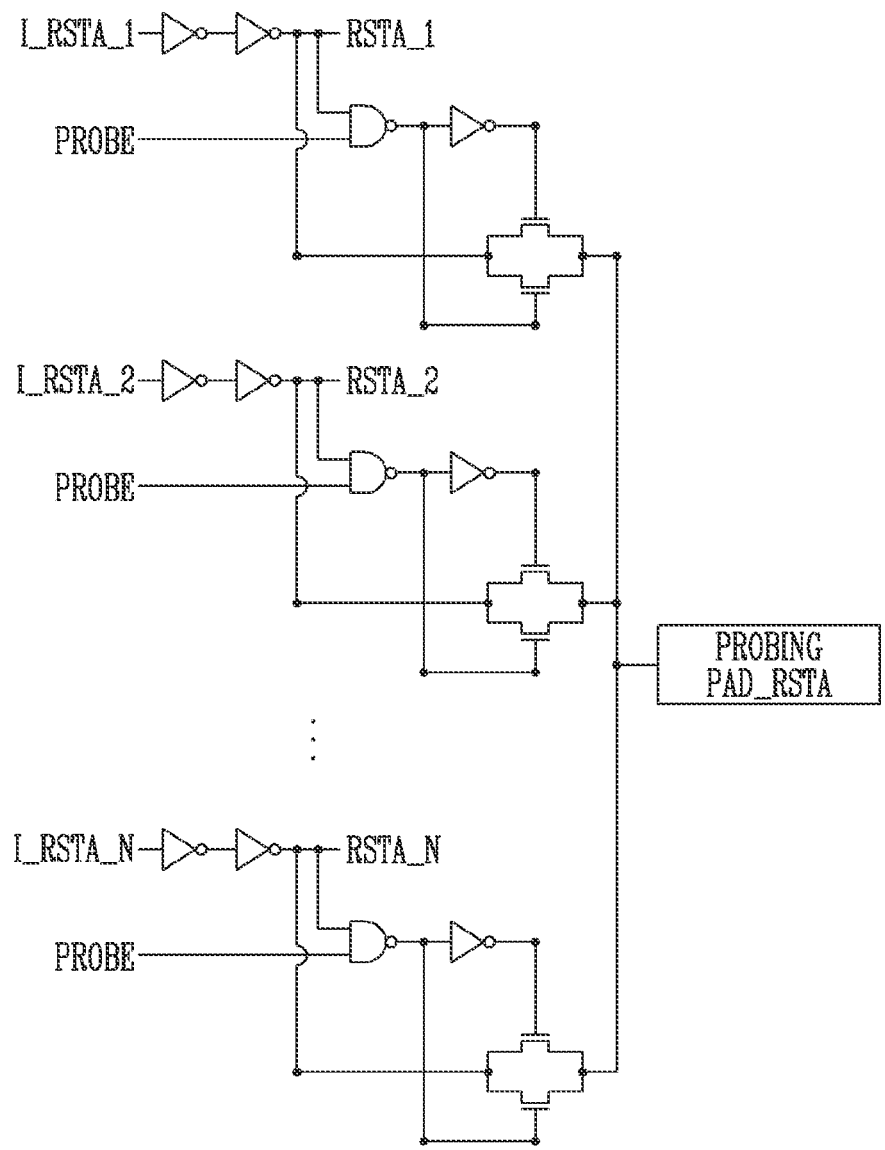
FIG. 10 is a diagram illustrating a probing operation of a memory device in accordance with an embodiment of the present disclosure.

FIG. 10 is a diagram illustrating a probing operation of a memory device in accordance with an embodiment of the present disclosure.

FIG. 10 illustrates an operation of probing an Ath reset signal RSTA among the page buffer signals shown in FIG. 8. Although the operation of probing the Ath reset signal RSTA is described with respect to FIG. 10, this is for convenience of description, and the probing operation may be applied identically to other page buffer control signals RSTB, RSTC, RSTD, SETA, SETB, SETC, SETD, TRANA, TRANB, TRANC, TRAND, TRANA_N, TRANB_N, TRANC_N, and TRAND_N in addition to the Ath reset signal RSTA.

Referring to FIG. 10, a probing pad PROBING PAD_RSTA corresponding to the Ath reset signal among a plurality of probing pads may be a pad for probing Ath reset signals RSTA_1 to RSTA_N provided to each of the plurality of page buffer stages 1th to Nth stages.

For example, when transistors connected to the probing pad PROBING PAD_RSTA are turned on by the probing control signal PROBE, the probing pad PROBING PAD_RSTA may probe the Ath reset signals RSTA_1 to RSTA_N. The Ath reset signals RSTA_1 to RSTA_N may be probed through a probing path connected to the probing pad PROBING PAD_RSTA. In other words, the probing pad PROBING PAD_RSTA may probe only Ath reset signals RSTA_1 to RSTA_N corresponding to the same kind among the page buffer control signals provided to the plurality of page buffer stages 1th to Nth stages.

On the other hand, when the transistors connected to the probing pad PROBING PAD_RSTA are turned off by the probing control signal PROBE, the probing pad PROBING PAD_RSTA does not perform the probing operation.

Thus, in accordance with the embodiment of the present disclosure, page buffer control signals having the same kind while being provided to different page buffer stages are probed through the same probing pad, so that page buffer control signals can be checked by using a reduced or minimum number of pads.

Figure 11:
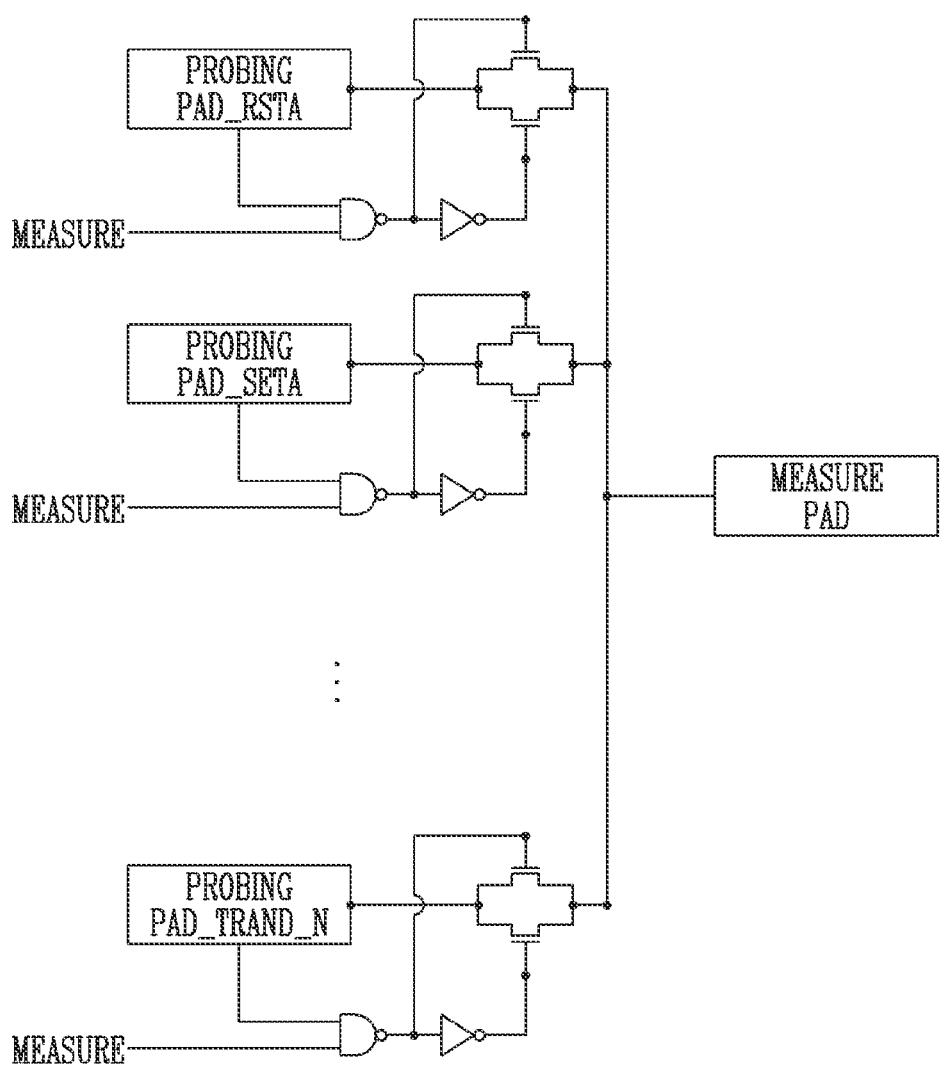
FIG. 11 is a diagram illustrating a measuring operation of a memory device in accordance with an embodiment of the present disclosure.

FIG. 11 is a diagram illustrating a measuring operation of a memory device in accordance with an embodiment of the present disclosure.

FIG. 11 illustrates a measuring operation in a state in which each of the page buffer control signals shown in FIG. 8 is probed by a corresponding probing pad. For example, it is assumed that each of page buffer control signals provided to a plurality of page buffer stages is probed by any one of probing pads PROBING PAD_RSTA, PROBING PAD_RSTB, . . . , and PROBING PAD_TRAND_N, based on a kind of the page buffer control signals. In FIG. 11, for convenience of description, only the probing pad PROBING PAD_RSTA corresponding to the Ath reset signal, a probing pad PROBING PAD_RSTB corresponding to a Bth reset signal RSTB, and a probing pad PROBING PAD_TRAND_N corresponding to a transmission signal TRAND_N are illustrated. However, the measuring operation described with reference to FIG. 11 may be applied identically to probing pads corresponding to other page buffer control signals RSTC, RSTD, SETA, SETB, SETC, SETD, TRANA, TRANB, TRANC, TRAND, TRANA_N, TRANB_N, and TRANC_N.

Referring to FIG. 11, a measuring pad MEASURE PAD may measure page buffer control signals probed by a plurality of probing pads.

For example, when transistors connected between the probing pad PROBING PAD_RSTA and the measuring pad MEASURE PAD are turned on by the measurement control signal MEASURE, the measuring pad MEASURE PAD may measure Ath reset signals probed by the probing pad PROBING PAD_RSTA. Also, when transistors connected between the probing pad PROBING PAD_RSTB and the measuring pad MEASURE PAD are turned on by the measurement control signal MEASURE, the measuring pad MEASURE PAD may measure Bth reset signals probed by the probing pad PROBING PAD_RSTB. Also, when transistors connected between the probing pad PROBING PAD_TRAND_N and the measuring pad MEASURE PAD are turned on by the measurement control signal MEASURE, the measuring pad MEASURE PAD may measure transmission signals probed by the probing pad PROBING PAD_TRAND_N.

On the other hand, when transistors connected to probing pads PROBING PAD_RSTA, PROBING PAD_RSTB, . . . , and PROBING PAD_TRAND_N are turned off by the measurement control signal MEASURE, the measuring pad MEASURE PAD does not perform the measuring operation.

Thus, in accordance with the embodiment of the present disclosure, page buffer control signals probed by a plurality of probing pads are measured through one measuring pad, so that page buffer control signals can be measured even in a package-type memory device.

Figure 12:
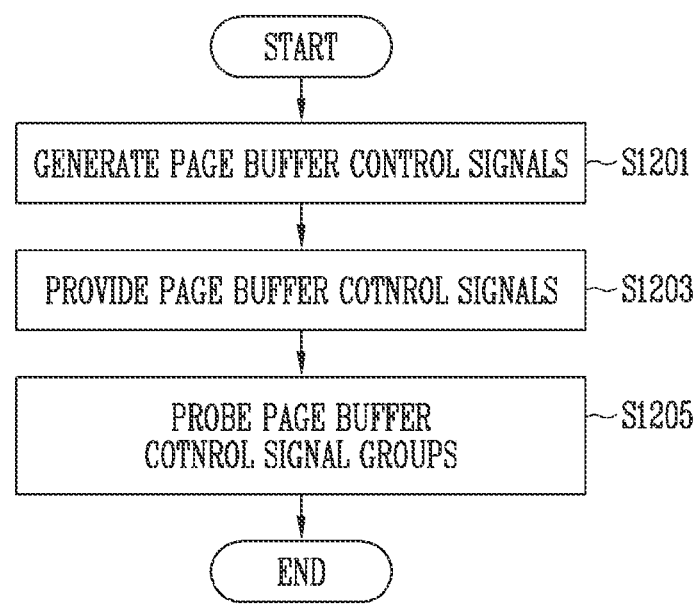
FIG. 12 is a flowchart illustrating an operating method of a memory device in accordance with an embodiment of the present disclosure.

FIG. 12 is a flowchart illustrating an operating method of a memory device in accordance with an embodiment of the present disclosure.

The operating method shown in FIG. 12 may be performed by the memory device 900 shown in FIG. 9.

Referring to FIG. 12, in step S1201, the memory device 900 may generate page buffer control signals for controlling a plurality of page buffers.

In step S1203, the memory device 900 may provide the page buffer control signals to the plurality of page buffers.

The memory device 900 may provide, in parallel, a plurality of page buffer control signals to a plurality of page buffer stages including the plurality of page buffers.

In step S1205, the memory device 900 may probe each of a plurality of page buffer control signal groups configured with the page buffer control signals through a probing path corresponding to each of the plurality of page buffer control signal groups.

Each of the plurality of page buffer control signal groups may include page buffer control signals having the same kind while being applied in parallel to different page buffer stages among the page buffer control signals.

Figure 13:
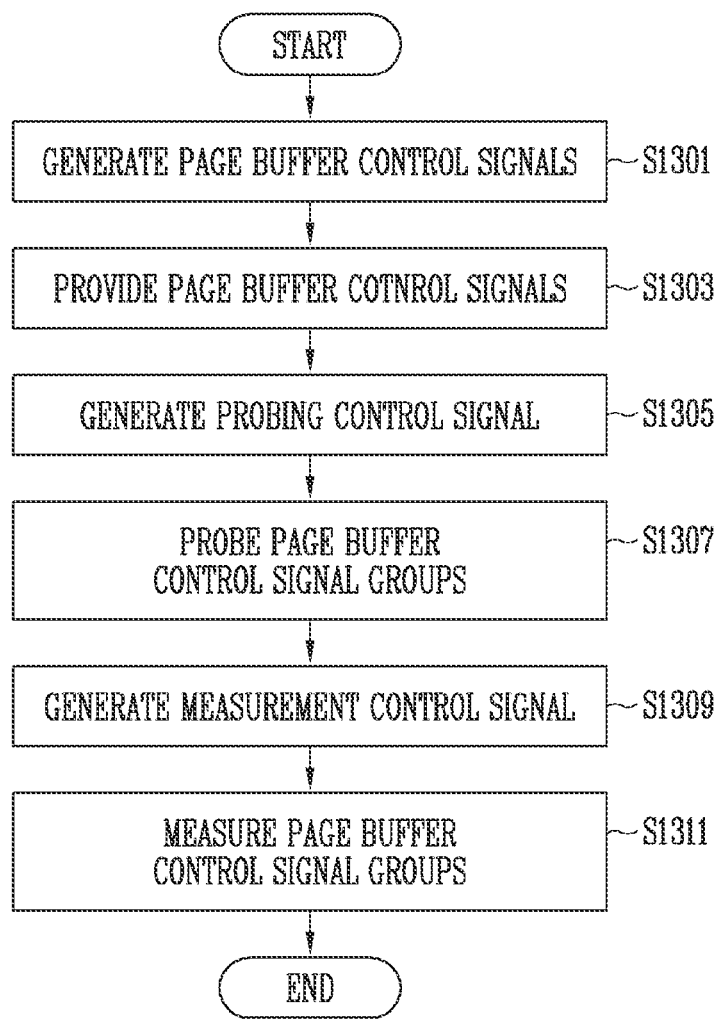
FIG. 13 is a flowchart illustrating an operating method of a memory device in accordance with an additional embodiment of the present disclosure.

FIG. 13 is a flowchart illustrating an operating method of a memory device in accordance with an additional embodiment of the present disclosure.

The operating method shown in FIG. 13 may be performed by the memory device 900 shown in FIG. 9.

Referring to FIG. 13, in step S1301, the memory device 900 may generate page buffer control signals for controlling a plurality of page buffers.

In step S1303, the memory device 900 may provide the page buffer control signals to the plurality of page buffers.

In step S1305, the memory device 900 may generate a probing control signal for controlling a probing operation of a plurality of probing pads.

In step S1307, the memory device 900 may probe each of a plurality of page buffer control signal groups configured with the page buffer control signals through a probing path corresponding to each of the plurality of page buffer control signal groups.

The memory device 900 may turn on transistors connected between the plurality of page buffers and the plurality of probing pads according to the probing control signal. Also, the memory device 900 may probe a page buffer control signal group corresponding to each of the plurality of probing pads among the plurality of page buffer control signal groups by using each of the plurality of probing pads.

In step S1309, the memory device 900 may generate a measurement control signal for controlling a measuring operation of a measuring pad.

In step S1311, the memory device 900 may measure page buffer control signals probed by the plurality of probing pads by using the measuring pad.

The memory device 900 may turn on transistors connected between the plurality of probing pads and the measuring pad according to the measurement control signal. Also, the memory device 900 may measure the probed page buffer control signals.

Figure 14:
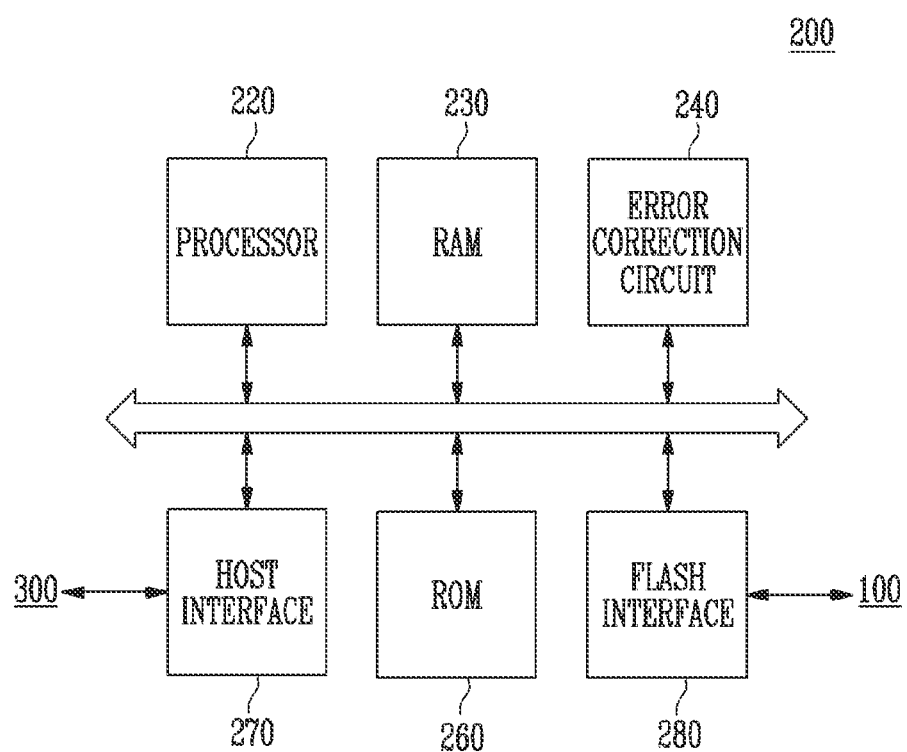
FIG. 14 is a diagram illustrating a memory controller shown in FIG. 1.

FIG. 14 is a diagram illustrating the memory controller 200 shown in FIG. 1.

Referring to FIGS. 1 and 14, the memory controller 200 may include a processor 220, RAM 230, an error correction circuit 240, ROM 250, a host interface 270, and a flash interface 280.

The processor 220 may control overall operations of the memory controller 200. The RAM 230 may be used as buffer memory, cache memory, working memory, etc. of the memory controller 200.

The error correction circuit 240 may perform error correction. The error correction circuit 240 may perform error correction code (ECC) encoding on data to be written to the memory device through the flash interface 280. The ECC-encoded data may be transferred to the memory device through the flash interface 280. The error correction circuit 240 may perform ECC decoding on data received from the memory device through the flash interface 280. The error correction circuit 240, for example, may be included as a component of the flash interface 280 in the flash interface 280.

The ROM 260 may store, in the form of firmware, various information required in an operation of the memory controller 200.

The memory controller 200 may communicate with an external device (e.g., the host 300, an application processor, or the like) through the host interface 270.

The memory controller 200 may communicate with the memory device 100 through the flash interface 280. The memory controller 200 may transmit a command CMD, an address ADDR, a control signal CTRL, and the like to the memory device 100 through the flash interface 280, and receive data DATA. The flash interface 280, for example, may include a NAND interface.

Figure 15:
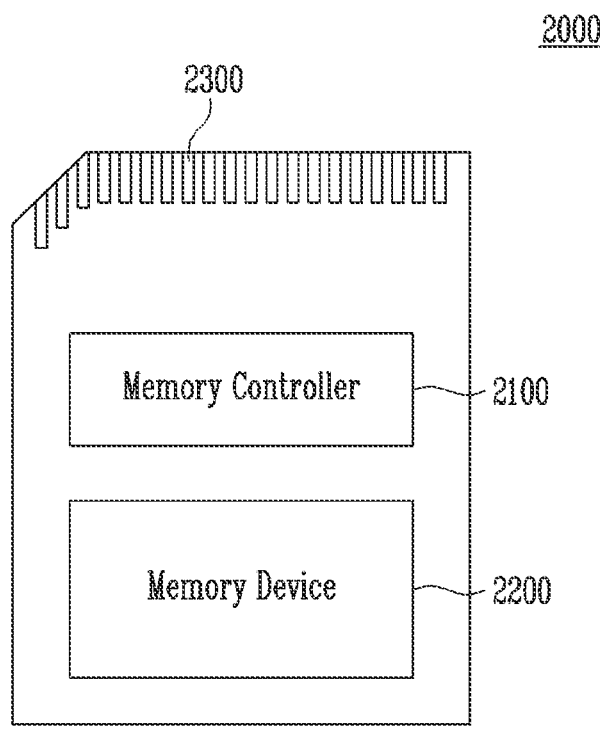
FIG. 15 is a block diagram illustrating a memory card system to which a storage device is applied in accordance with an embodiment of the present disclosure.

FIG. 15 is a block diagram illustrating a memory card system 2000 to which the storage device is applied in accordance with an embodiment of the present disclosure.

Referring to FIG. 15, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control read, write, erase, and background operations of the memory device 2200. The memory controller 2100 provides an interface between the memory device 2200 and a host Host. The memory controller 2100 drives firmware for controlling the memory device 2200. The memory controller 2100 may be implemented identically to the memory controller 200 described with reference to FIG. 1. The memory device 2200 may be implemented identically to the memory device 100 described with reference to FIG. 2.

The memory controller 2100, for example, may include components such as Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. The memory controller 2100, for example, may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. The connector 2300 may be defined by at least one of the above-described various communication protocols.

The memory device 2200, for example, may be implemented with various nonvolatile memory types such as Electrically Erasable and Programmable ROM (EEPROM), NAND flash memory, NOR flash memory, Phase-change RAM (PRAM), Resistive RAM (ReRAM), Ferroelectric RAM (FRAM), and Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 16:
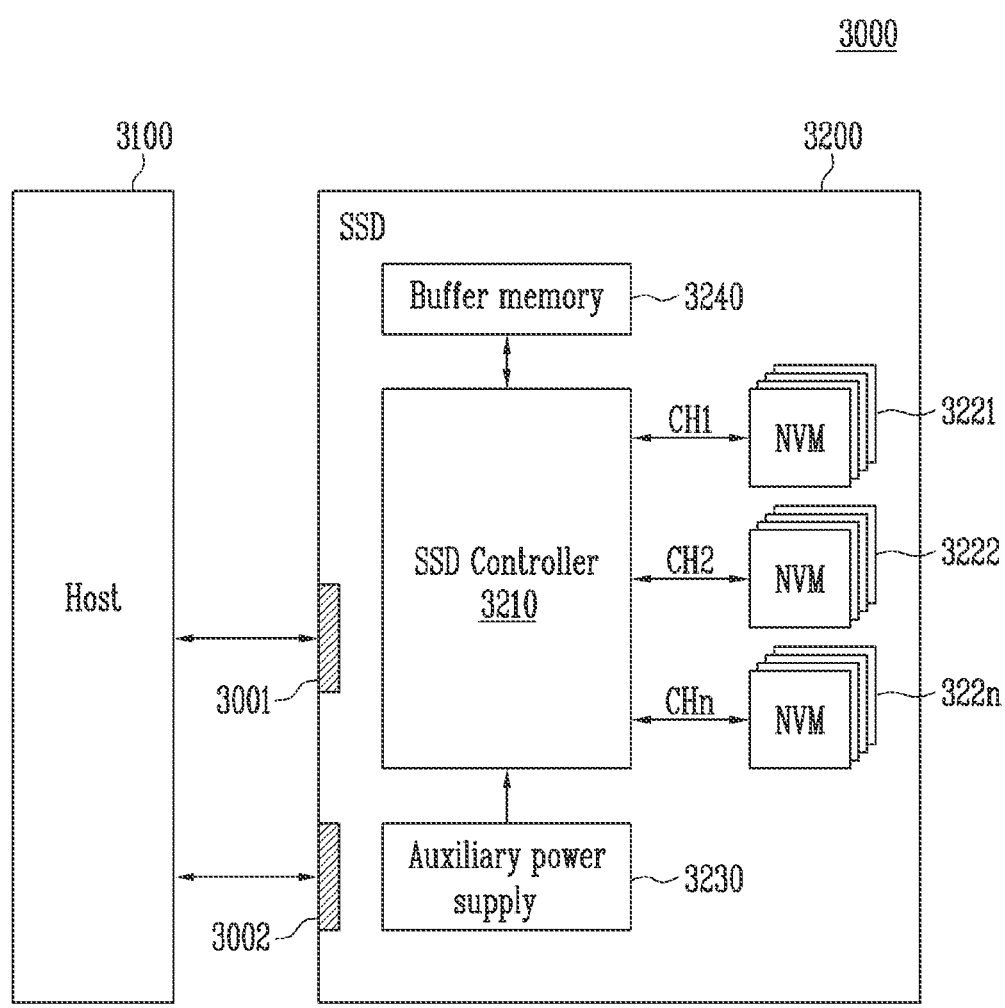
FIG. 16 is a block diagram illustrating a Solid State Drive (SSD) system to which a storage device is applied in accordance with an embodiment of the present disclosure.

FIG. 16 is a block diagram illustrating a Solid State Drive (SSD) system 3000 to which the storage device is applied in accordance with an embodiment of the present disclosure.

Referring to FIG. 16, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. The signal SIG, for example, may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. The auxiliary power supply 3230 may receive the power PWR input from the host 3100, and charge the power PWR. When the supply of power from the host 3100 is not smooth, the auxiliary power supply 3230 may provide power of the SSD 3200. The auxiliary power supply 3230, for example, may be located in the SSD 3200, or be located at the outside of the SSD 3200. For example, the auxiliary power supply 3230 may be located on a main board, and provide auxiliary power to the SSD 3200.

The buffer memory 3240 operates as buffer memory of the SSD 3200. For example, the buffer memory 3240 may temporarily store data received from the host 3100 or data received from the plurality of flash memories 3221 to 322n, or temporarily store metadata (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 17:
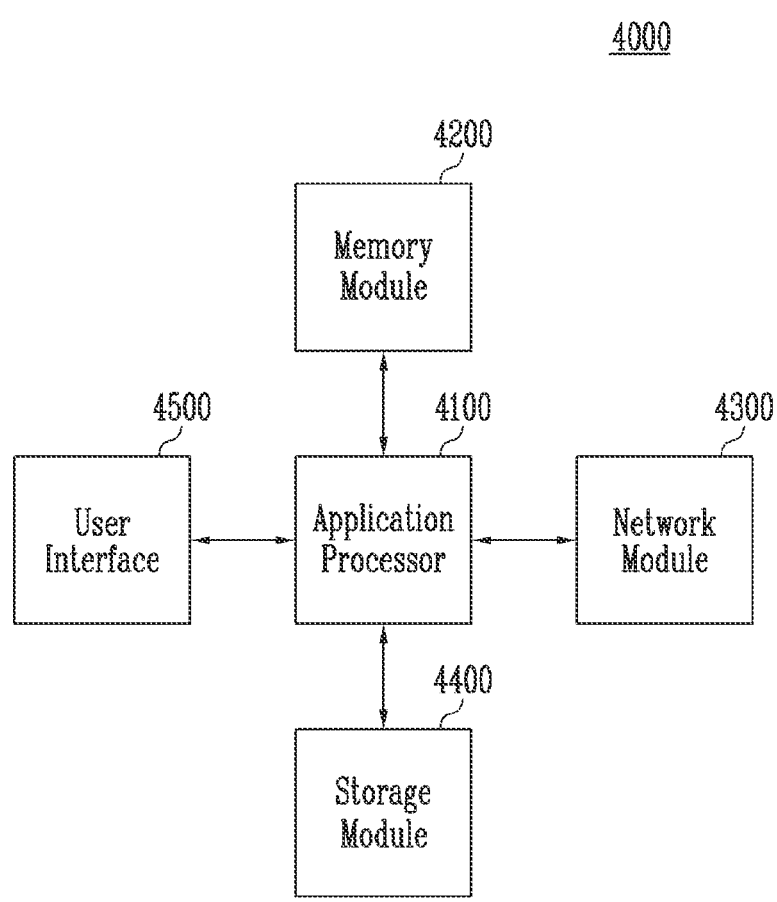
FIG. 17 is a block diagram illustrating a user system to which a storage device is applied in accordance with an embodiment of the present disclosure.

FIG. 17 is a block diagram illustrating a user system 4000 to which the storage device is applied in accordance with an embodiment of the present disclosure.

Referring to FIG. 17, the user system 4000 includes an application processor 4100, a memory module 4200, a network module 4300, a storage module 4400, and a user interface 4500.

The application processor 4100 may drive components included in the user system 4000, an operating system (OS), a user program, or the like. The application processor 4100, for example, may include controllers for controlling components included in the user system 4000, interfaces, a graphic engine, and the like. The application processor 4100 may be provided as a System-on-Chip (SoC).

The memory module 4200 may operate as main memory, working memory, buffer memory, or cache memory of the user system 4000. The memory module 4200 may include volatile random access memories such as DRAM, SDRAM, DDR SDRAM, DDR2 SDRM, DDR3 SDRAM, LPDDR SDRAM, LPDDR2 SDRAM, and LPDDR3 SDRAM or nonvolatile random access memories such as PRAM, ReRAM, MRAM, and FRAM. The application processor 4100 and the memory module 4200, for example, may be provided as one semiconductor package by being packaged based on a Package on Package (PoP).

The network module 4300 may communicate with external devices. The network module 4300, for example, may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. The network module 4300, for example, may be included in the application processor 4100.

The storage module 4400 may store data. For example, the storage module 4400 may store data received from the application processor 4100. Alternatively, the storage module 4400 may transmit data stored therein to the application processor 4100. The storage module 4400, for example, may be implemented with nonvolatile semiconductor memory such as Phase-change RAM (PRAM), Magnetic RAM (MRAM), Resistive RAM (RRAM), NAND flash, NOR flash, or NAND flash having a three-dimensional structure. The storage module 4400, for example, may be provided as a removable drive such as a memory card of the user system 4000 or an external drive.

The storage module 4400, for example, may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. The user interface 4500, for example, may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, is a memory device capable of checking a signal of a page buffer by using a reduced or minimum number of pads, and an operating method of the memory device.

While the present disclosure has been shown and described with reference to certain embodiments, it will be understood by those skilled in the art that various changes in form and detail may be made to the presented embodiments without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a page buffer circuit including a plurality of page buffer stages each including a plurality of page buffers; and
   a control circuit configured to:
   generate page buffer control signals for controlling the plurality of page buffers; and
   probe each of a plurality of page buffer control signal groups configured with the page buffer control signals through a probing path corresponding to each of the plurality of page buffer control signal groups,
   wherein the plurality of page buffer control signal groups are configured with different kinds of page buffer control signals from each other, and
   wherein the control circuit includes:
   a plurality of probing pads each connected to the plurality of page buffers according to a probing control signal for turning on transistors connected between the plurality of page buffers and the plurality of probing pads, and probing any one of the plurality of page buffer control signal groups; and
   a measuring pad connected to the plurality of probing pads according to a measurement control signal for turning on transistors connected between the plurality of probing pads and the measuring pad, and measuring page buffer control signal groups probed by the plurality of probing pads.

2. The memory device of claim 1, wherein the control circuit further includes:

a control signal generator configured to generate the page buffer control signals and the probing control signal.

3. The memory device of claim 2, wherein the control signal generator generates the measurement control signal.

4. The memory device of claim 1, wherein the page buffer control signals include at least one of a transmission signal, a set signal, and a reset signal.

5. The memory device of claim 1, wherein each of the plurality of page buffer control signal groups includes page buffer control signals having the same kind while being provided in parallel to different page buffer stages among the page buffer control signals.

6. A method for operating a memory device including a plurality of probing pads and a measuring pad, the method comprising:
generating page buffer control signals for controlling a plurality of page buffers;
providing the page buffer control signals to the plurality of page buffers;
generating a probing control signal;
turning on transistors connected between the plurality of page buffers and the plurality of probing pads according to the probing control signal;
probing each of a plurality of page buffer control signal groups configured with the page buffer control signals through a probing path corresponding to each of the plurality of page buffer control signal groups by using each of the plurality of probing pads;
generating a measurement control signal;
turning on transistors connected between the plurality of probing pads and the measuring pad according to the measurement control signal; and
measuring page buffer control signal groups probed by the plurality of probing pads by using the measuring pad,
wherein the plurality of page buffer control signal groups are configured with different kinds of page buffer control signals from each other.

7. The method of claim 6, wherein providing the page buffer control signals to the plurality of page buffers includes providing the page buffer control signals in parallel to a plurality of page buffer stages including the plurality of page buffers.

8. The method of claim 7, wherein each of the plurality of page buffer control signal groups includes page buffer control signals having the same kind while being applied in parallel to different page buffer stages among the page buffer control signals.

9. A control circuit for controlling signals provided to a plurality of page buffer control stages each including a plurality of page buffers, the control circuit comprising:
a plurality of probing pads each connected to the plurality of page buffers according to a probing control signal, and probing any one of a plurality of page buffer control signal groups configured with page buffer control signals for controlling the plurality of page buffers;
a measuring pad connected to the plurality of probing pads according to a measurement control signal, and measuring page buffer control signal groups probed by the plurality of probing pads; and
a control signal generator configured to generate:
the page buffer control signals;
the probing control signal for turning on transistors connected between the plurality of page buffers and the plurality of probing pads; and
the measurement control signal for turning on transistors connected between the plurality of probing pads and the measuring pad,
wherein the plurality of page buffer control signal groups are configured with different kinds of page buffer control signals from each other.

10. The control circuit of claim 9, wherein each of the plurality of page buffer control signal groups includes page buffer control signals having the same kind while being provided in parallel to different page buffer stages among the page buffer control signals.

* * * * *